United States Patent
Park et al.

(10) Patent No.: US 10,340,000 B2
(45) Date of Patent: Jul. 2, 2019

(54) OPERATING METHOD OF MEMORY DEVICE

(71) Applicant: Samsung Electronics Co., Ltd., Suwon-si, Gyeonggi-do (KR)

(72) Inventors: Hyun Kook Park, Anyang-si (KR); Jung Sunwoo, Seoul (KR); Chi Weon Yoon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/795,245

(22) Filed: Oct. 26, 2017

(65) Prior Publication Data

US 2018/0277206 A1    Sep. 27, 2018

(30) Foreign Application Priority Data

Mar. 24, 2017 (KR) .......................... 10-2017-0037866

(51) Int. Cl.
*G11C 13/00* (2006.01)

(52) U.S. Cl.
CPC ...... *G11C 13/0038* (2013.01); *G11C 13/0023* (2013.01); *G11C 13/0033* (2013.01); *G11C 13/0069* (2013.01); *G11C 2213/71* (2013.01)

(58) Field of Classification Search
None
See application file for complete search history.

(56) References Cited

U.S. PATENT DOCUMENTS

| | | | |
|---|---|---|---|
| 7,123,535 B2 | 10/2006 | Kurotsuchi et al. |
| 7,283,391 B2 | 10/2007 | Ueda et al. |
| 7,679,954 B2 | 3/2010 | Lee et al. |
| 7,796,426 B2 | 9/2010 | Tonomura et al. |
| 8,116,127 B2 | 2/2012 | Cho et al. |
| 8,184,470 B2 | 5/2012 | Toda et al. |
| 8,446,756 B2 | 5/2013 | Shiimoto et al. |

(Continued)

FOREIGN PATENT DOCUMENTS

JP    2009252253 A    10/2009

*Primary Examiner* — Douglas King
(74) *Attorney, Agent, or Firm* — Renaissance IP Law Group LLP (57) ABSTRACT

An operating method of a memory device is provided. Using a statistical model, a resistance $R_{dyn}$ of a variable resistor of a memory cell and a variation $\Delta R_{dyn}$ of the resistance $R_{dyn}$ are determined. Based on the resistance $R_{dyn}$ and the variation $\Delta R_{dyn}$ of the resistance $R_{dyn}$, an average resistance $R_{dyn\_avg}$ and a beta value of the variable resistor are determined. Then, using the average resistance $R_{dyn\_avg}$ and the beta value, a resistance $R_a$ of an insertion resistor, connected between the memory cell and a power supply generator for generating a power supply voltage $V_{PGM}$, is determined.

15 Claims, 10 Drawing Sheets

(56) References Cited

U.S. PATENT DOCUMENTS

| | | | |
|---|---|---|---|
| 2005/0117388 A1* | 6/2005 | Cho | G11C 13/0004 |
| | | | 365/163 |
| 2011/0116300 A1* | 5/2011 | Maejima | G11C 8/08 |
| | | | 365/148 |
| 2016/0125942 A1* | 5/2016 | Yoon | G11C 13/0069 |
| | | | 365/148 |
| 2017/0263299 A1* | 9/2017 | Takizawa | G11C 7/04 |

* cited by examiner

| 1_1 | 1_2 | 1_3 | 1_4 | 1_5 | 1_6 | 1_7 | 1_8 |
|---|---|---|---|---|---|---|---|
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| SA/WD(2_1) || SA/WD(2_2) || SA/WD(2_3) || SA/WD(2_4) ||
| PERIPHERY(3) |||||||||
| SA/WD(2_8) || SA/WD(2_7) || SA/WD(2_6) || SA/WD(2_5) ||
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| 1_16 | 1_15 | 1_14 | 1_13 | 1_12 | 1_11 | 1_10 | 1_9 |

OPERATING METHOD OF MEMORY DEVICE

This application claims priority under 35 U.S.C. § 119 to Korean Patent Application No. 10-2017-0037866, filed on Mar. 24, 2017 in the Korean Intellectual Property Office, the disclosure of which is incorporated by reference herein in its entirety.

TECHNICAL FIELD

The present inventive concept relates to an operating method of a memory device.

DISCUSSION OF RELATED ART

Nonvolatile memory devices include a phase-change random access memory (PRAM), a resistive random access memory (RRAM), and a magnetic random access memory (MRAM). The non-volatile memory devices use a change in resistance as a mechanism for storing information.

SUMMARY

According to an exemplary embodiment of the present inventive concept, a method of operating a memory device is provided as follows. A statistical model is used to determine a resistance $R_{dyn}$ of a variable resistor of a memory cell and a variation $\Delta R_{dyn}$ of the resistance $R_{dyn}$. The resistance $R_{dyn}$ and the variation $\Delta R_{dyn}$ of the resistance $R_{dyn}$ are used to determine an average resistance $R_{dyn\_avg}$ and a beta value of the variable resistor. The average resistance $R_{dyn\_avg}$ and the beta value are used in turn to determine the resistance $R_a$ of an insertion resistor, connected between the memory cell and a power supply generator for generating a power supply voltage $V_{PGM}$.

According to an exemplary embodiment of the present inventive concept, an operating method of a memory device is provided as follows. A statistical model is used to determine a resistance $R_{dyn}$ of a variable resistor of a memory cell and a variation $\Delta R_{dyn}$ in the resistance $R_{dyn}$. The resistance $R_{dyn}$ and the variation $\Delta R_{dyn}$ of the resistance $R_{dyn}$ are used to determine an average resistance $R_{dyn\_avg}$ and a beta value of the variable resistor. The average resistance $R_{dyn\_avg}$ is used to determine the beta value A first resistance $R_L$. A resistance $R_{para}$ of a parasitic resistor is determined. The parasitic resistor is disposed between the memory cell and a power supply generator for generating a power supply voltage $V_{PGM}$. The first resistance $R_L$ and the resistance $R_{para}$ of the parasitic resistor are used to determine a resistance $R_a$ of an insertion resistor connected between the memory cell and the power supply generator.

According to an exemplary embodiment of the present inventive concept, an operating method of a memory device including a variable resistor of a memory cell, a power supply generator, and an insertion resistor connected between the variable resistor of the memory cell and the power supply generator is provided as follows. A statistical model is used to determine a resistance $R_{dyn}$ of the variable resistor and a variation $\Delta R_{dyn}$ of the resistance $R_{dyn}$. Based on the resistance $R_{dyn}$ of the variable resistor and the variation $\Delta R_{dyn}$ of the resistance $R_{dyn}$, a resistance $R_a$ of an insertion resistor is determined. Based on the resistance $R_{dyn}$ of the variable resistor and the resistance Ra of the insertion resistor, a power supply voltage $V_{PGM}$ is generated. The power supply voltage $V_{PGM}$ is applied to the variable resistor and the insertion resistor connected in series.

BRIEF DESCRIPTION OF THE DRAWINGS

These and other features of the present inventive concept will become more apparent by describing in detail exemplary embodiments thereof with reference to the accompanying drawings of which.

DETAILED DESCRIPTION OF EXEMPLARY EMBODIMENTS

Figure 1:
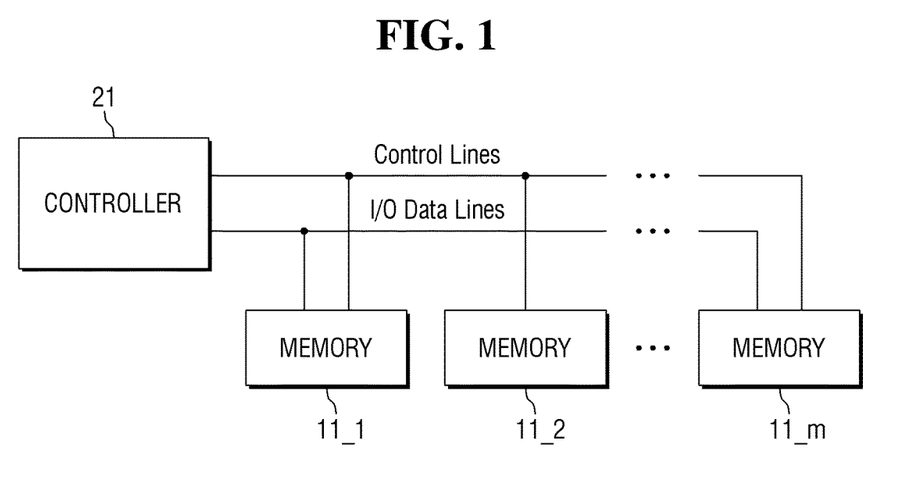
FIG. 1 is a block diagram of a memory system according to an exemplary embodiment of the present inventive concept.

FIG. 1 is a block diagram of a memory system according to an exemplary embodiment of the present inventive concept.

Referring to FIG. 1, the memory system according to an exemplary embodiment includes a plurality of memory devices 11_1 through 11_m (where m is a natural number) and a memory controller 21.

The memory devices 11_1 through 11_m and the memory controller 21 are connected via control lines and input/output (I/O) data lines. For example, the memory controller 21 may provide various commands (for example, a write command, a read command, and the like) to the memory devices 11_1 through 11_m via the control lines. Also, the memory controller 21 may exchange data with the memory devices 11_1 through 11_m via the I/O data lines.

The memory devices 11_1 through 11_m are illustrated as sharing the control lines and the I/O data lines with one another, but the present inventive concept is not limited thereto. For example, the memory devices 11_1 through 11_m may share the I/O data lines, but may not share the control lines.

The memory devices 11_1 through 11_m may include various types of memory devices. The memory devices 11_1 through 11_m may include volatile memory devices such as, for example, dynamic random-access memory (DRAM), and nonvolatile memory devices such as, for example, NAND flash memory or NOR flash memory. The memory devices 11_1 through 11_m may also include nonvolatile memory devices using a resistive material such as, for example, phase-change random access memory (PRAM), resistive random-access memory (RRAM), and magnetic random-access memory (MRAM).

Figure 2:
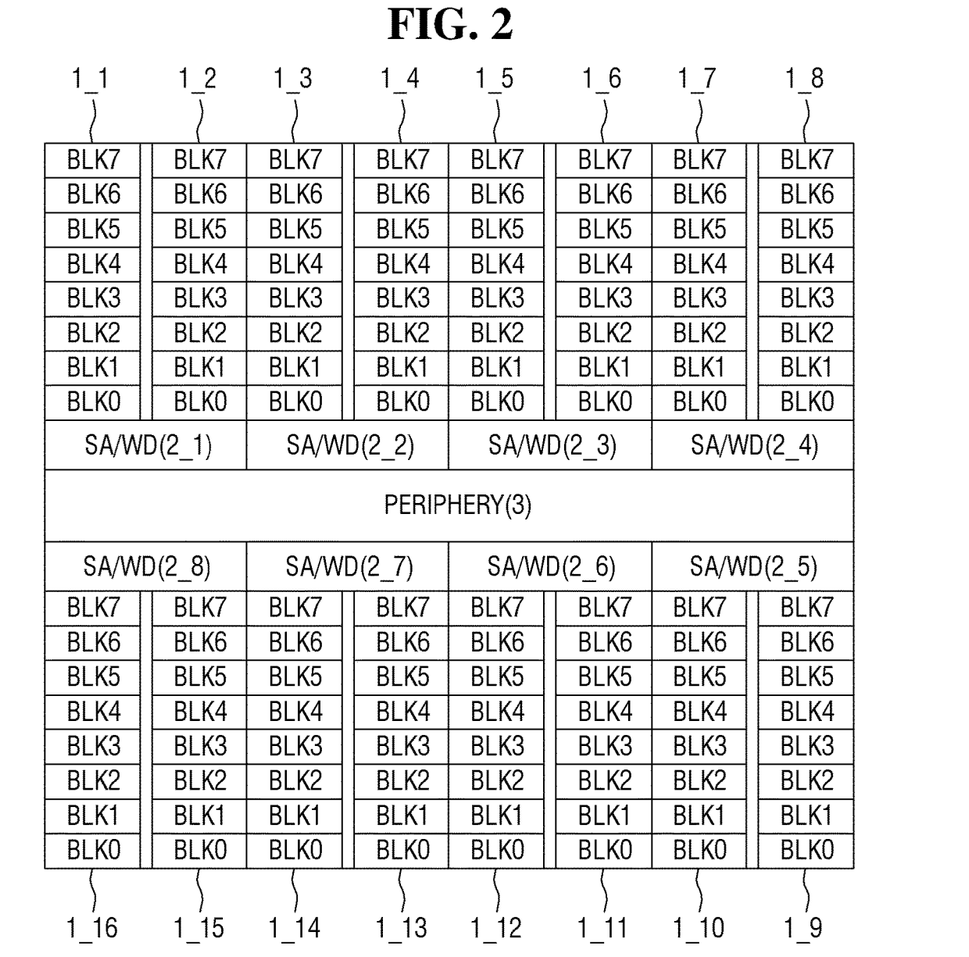
FIG. 2 is a block diagram of a memory device according to an exemplary embodiment of the present inventive concept.

FIG. 2 is a block diagram of a memory device according to an exemplary embodiment of the present inventive concept. For the convenience of description, the memory devices 11_1 through 11_m each will be assumed to be a nonvolatile memory device having sixteen memory banks. The present inventive concept, however, is not limited thereto.

Referring to FIG. 2, the nonvolatile memory device includes a memory cell array, a plurality of sense amplifiers/write drivers 2_1 through 2_8, and a peripheral circuit region 3.

The memory cell array may include a plurality of memory banks 1_1 through 1_16, each of the memory banks 1_1 through 1_16 may include a plurality of memory blocks BLK0 through BLK7, and each of the memory blocks BLK0 through BLK7 may include a plurality of nonvolatile memory cells that are arranged in a matrix. Eight memory blocks are provided in each of the memory banks 1_1 through 1_16, but the present inventive concept is not limited thereto.

Although not specifically illustrated, a row selection circuit for designating a row of resistive memory cells to read or write and a column selection circuit for designating a column of resistive memory cells to read or write may be disposed to correspond with the memory banks 1_1 through 1_16.

Each of the sense amplifiers/write drivers 2_1 through 2_8 is disposed to correspond with, and perform read and write operations on, two memory banks. For example, a first bank 1_1 and a second bank 1_2 share a first sense amplifiers/write driver 2_1; and a fifteenth bank 1_15 and a sixteenth bank 1_16 share an eighth sense amplifiers/write driver 2_8. In the present exemplary embodiment, each of the sense amplifiers/write drivers 2_1 through 2_8 is disposed to correspond with two memory banks, but the present inventive concept is not limited thereto. For example, each of the sense amplifiers/write drivers 2_1 through 2_8 may be disposed to correspond with one memory bank or four memory banks.

In the peripheral circuit region 3, logic circuit blocks and voltage generators for operating the column selection circuit, the row selection circuit, and the sense amplifiers/write drivers 2_1 through 2_8 may be provided.

Figure 3A:
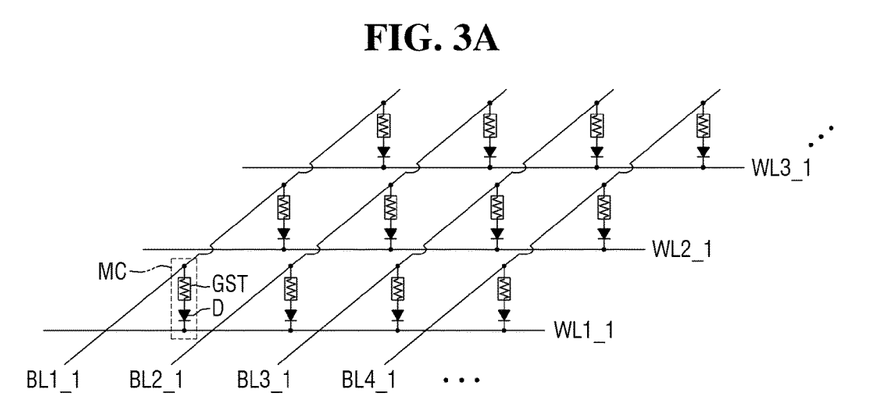
FIGS. 3A, 3B, and 4 are views illustrating the memory cell array of FIG. 2 according to exemplary embodiments of the present inventive concept.
Figure 3B:
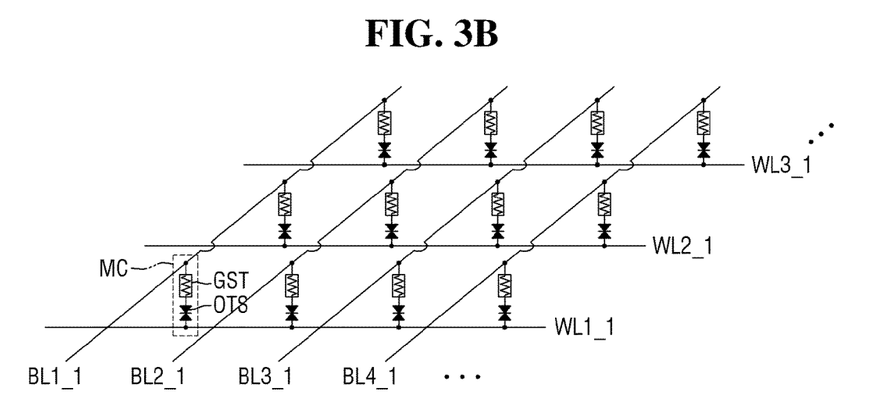
Figure 4:
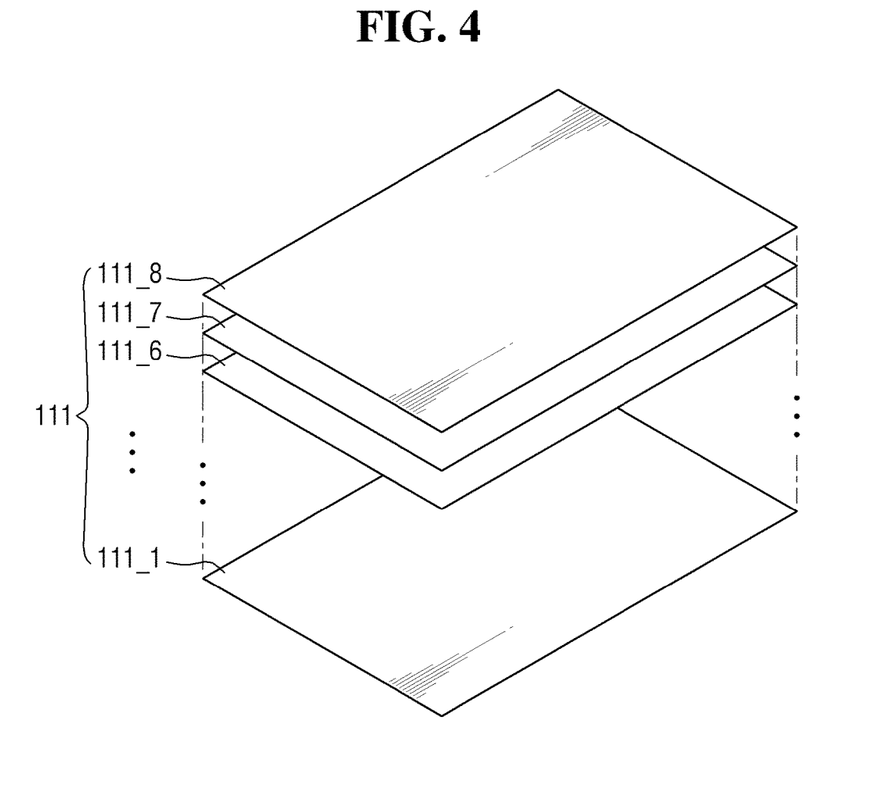

FIGS. 3A, 3B, and 4 are views illustrating the memory cell array of FIG. 2.

Referring to FIGS. 3A and 3B, the memory cell array may have a cross point structure. The cross-point structure is a structure in which one memory cell is formed at the intersection between one line and another line. For example, bitlines BL1_1 through BL4_1 are formed to extend in a first direction, wordlines WL1_1 through WL3_1 are formed to intersect the bitlines BL1_1 through BL4_1, and resistive memory cells MC are respectively formed at the intersections between the bitlines BL1_1 through BL4_1 and the wordlines WL1_1 through WL3_1.

In a case where the resistive memory cells MC are PRAMs, each of the resistive memory cells MC includes a variable resistor GST having a phase-change material and an access element controlling a current that flows in the variable resistor GST.

Referring to FIG. 3A, the access element of each of the resistive memory cells MC may be a diode D or a transistor (not illustrated) connected in series to the variable resistor GST between one of the bitlines BL1_1 through BL4_1 and one of the wordlines WL1_1 through WL3_1. The present inventive concept, however, is not limited thereto. For example, referring to FIG. 3B, the access element of each of the resistive memory cells MC may be an ovonic threshold switch (OTS) connected in series to the variable resistors GST between one of the bitlines BL1_1 through BL4_1 and one of the wordlines WL1_1 through WL3_1.

Examples of the phase-change material include a binary compound of two elements such as GaSb, InSb, InSe, $Sb_2Te_3$, and GeTe; a ternary compound of three elements such as GeSbTe, GaSeTe, InSbTe, $SnSb_2Te_4$, and InSbGe; or a compound of four elements such as AgInSbTe, (GeSn)SbTe, GeSb(SeTe), or $Te_{81}Ge_{15}Sb_2S_2$. In an exemplary embodiment, GeSbTe, which is composed of germanium (Ge), antimony (Sb), and tellurium (Te), may be used as the phase-change material.

In a case where the resistive memory cells MC are RRAMs, the variable resistor GST of each of the resistive memory cells MC may include, for example, NiO or perovskite. The perovskite may be a compound, such as manganite ($Pr_{0.7}Ca_{0.3}MnO_3$, $Pr_{0.5}Ca_{0.5}MnO_3$, other PCMO, LCMO, and the like), titernate (STO:Cr), and zirconate (SZO:Cr, $Ca_2Nb_2O_7$:Cr, and $Ta_2O_5$:Cr). The variable resistor GST of each of the resistive memory cells MC may have a shape of a filament and each variable resistor GST may serve as a current path for a cell current that flows through each of the resistive memory cells MC.

The memory cell array may have a three-dimensional (3D) stack structure, as illustrated in FIG. 4. The 3D stack structure is a structure in which a plurality of memory cell layers 111_1 through 111_8 are vertically stacked on each other. The memory cell array of FIG. 4 has a stack of eight memory cell layers 111_1 through 111_8, but the present inventive concept is not limited thereto. Each of the memory cell layers 111_1 through 111_8 may include a plurality of memory cell groups and/or a plurality of redundancy memory cell groups. In an exemplary embodiment, each of the memory cell layers 111_1 through 111_8 may have a cross point structure as illustrated in FIGS. 3A and 3B, for example, but the present inventive concept is not limited thereto.

Figure 5:
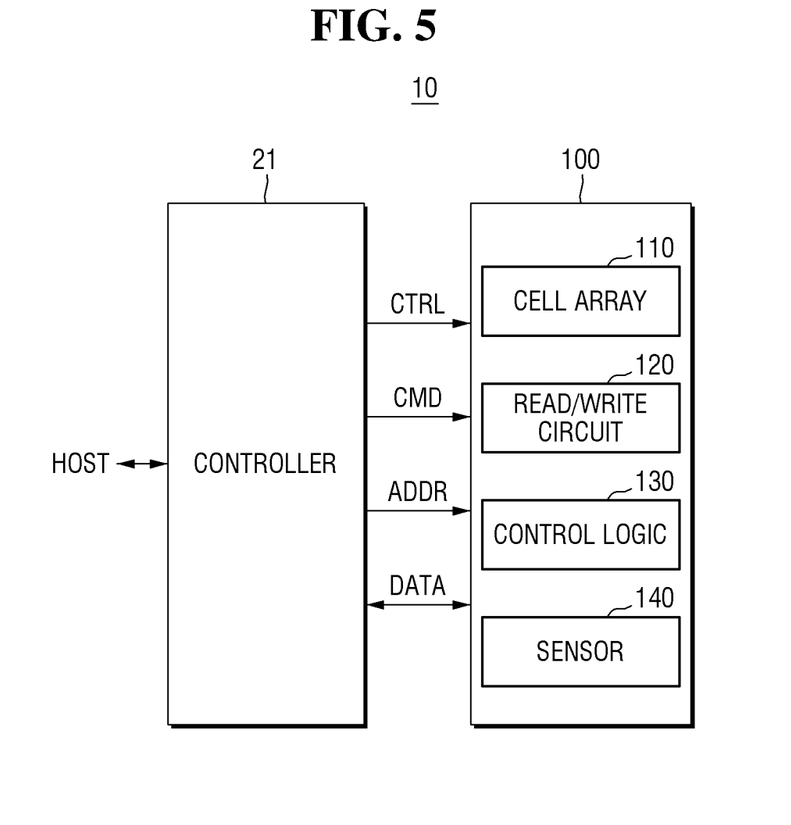
FIG. 5 is a block diagram of a memory system 10 including a memory device 100 according to an exemplary embodiment of the present inventive concept.

FIG. 5 is a block diagram of a memory system 10 including a memory device 100 according to an exemplary embodiment of the present inventive concept.

Referring to FIG. 5, the memory system 10 may include the memory device 100 and a memory controller 21. The memory device 100 may include a memory cell array 110, a read/write circuit 120, a control logic 130, and a sensor 140. The memory cell array 110 may include a plurality of resistive memory cells if the memory system 10 is a resistive memory system.

The memory controller 21 may control data read from, or written (or programmed) to, the memory device 100 in response to a read or write request being received from a host. For example, the memory controller 21 may control program, read, and erase operations for the memory device 100 by providing an address ADDR, a command CMD, and a control signal CTRL. Also, the memory controller 21 and the memory device 100 may exchange data DATA, which is written to or read from the memory device 100.

Although not specifically illustrated, the memory controller 21 may include a random-access memory (RAM), a processing unit, a host interface, and a memory interface. The RAM may be used as an operating memory of the processing unit. The processing unit may control the operation of the memory controller 21. The host interface may include a protocol for exchanging data between the host and the memory controller 21. The memory controller 21 may be configured to communicate with, for example, the host, via at least one of, for example, a universal serial bus (USB) protocol, a multimedia card (MMC) protocol, a peripheral component interconnection-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol.

The memory cell array 110 may include a plurality of memory cells (not illustrated), which are respectively disposed at the intersections between a plurality of first signal lines (not illustrated) and a plurality of second signal lines (not illustrated). For example, the first signal lines may be bitlines, and the second signal lines may be wordlines. The present inventive concept is not limited thereto. For example, the first signal lines may be wordlines, and the second signal lines may be bitlines.

The plurality of memory cells may be single-level cells (SLCs) which store only one bit or may be multi-level cells (MLCs) which store two or more bits. In an exemplary embodiment, the plurality of memory cells may include SLCs and MLCs. In a case where one-bit data is written to a memory cell, the memory cell may have, for example, two distributions of resistances, depending on the data written thereto. In a case where two-bit data is written to a memory cell, the memory cell may have, for example, four distributions of resistances, depending on the data written thereto. In a case in which three-bit data is written to a triple-level cell (TLC) capable of storing three-bit data, the TLC may have, for example, eight distributions of resistances, depending on the data written thereto. However, the present inventive concept is not limited to thereto. For example, the plurality of memory cells may include memory cells capable of storing four or more bits.

For example, the memory cell array 110 may include memory cells having a two-dimensional (2D) horizontal structure. The present inventive concept is not limited thereto. For example, the memory cell array 110 may include memory cells having a 3D vertical structure.

In an exemplary embodiment, the memory cell array 110 may include resistive memory cells.

The read/write circuit 120 performs write and read operations on the plurality of memory cells. The read/write circuit 120 may connect to the plurality of memory cells via a plurality of bitlines, and the read/write circuit 120 may include a write driver for writing data to the plurality of memory cells and a sense amplifier for sensing the resistance component of the plurality of memory cells.

The control logic 130 may control the overall operation of the memory device 100, and the control logic 130 may also control the read/write circuit 120 to perform memory operations such as write and read operations. For example, the memory device 100 may include a power supply generating circuit to generate various write and read voltages for use in write and read operations, and the levels of the write and read voltages may be adjusted under the control of the control logic 130.

For example, the memory device 100 may include a reference signal generating circuit to generate various reference signals for use in a read operation, and the reference signal generating means may generate a reference current or a reference voltage. The level of the reference current or the reference voltage may be adjusted under the control of the control logic 130.

During a write operation for the memory device 100, the resistance of the variable resistors of the plurality of memory cells of the memory cell array 110 may increase or decrease according to data to be written. For example, each of the plurality of memory cells of the memory cell array 110 may have a resistance corresponding to data currently stored therein, and the resistance of each of the plurality of memory cells of the memory cell array 110 may increase or decrease depending on data to be written. The write operation for the memory device 100 may be classified into a reset write operation or a set write operation. Resistive memory cells may have a relatively high resistance in their set state. During the reset write operation, a write operation is performed to increase the resistance of the variable resistors of the plurality of memory cells of the memory cell array 110. On the other hand, during the set write operation, a write operation is performed to lower the resistance of the variable resistors of the plurality of memory cells of the memory cell array 110.

A read operation for the memory device 100 may be performed by various read methods. In each of the various read methods, a read operation may be performed by one or more read factors, and the types of the read factors may differ from one read method to another read method. For example, a current sensing method may use a reference current and a reference voltage as read factors, and the method may determine data by applying the reference current to a selected memory cell and comparing the voltage of the sensing node of the selected memory cell caused by the reference current with the reference voltage. In another example, a voltage sensing method may use a precharge voltage and a reference voltage as read factors, and the method determine data by precharging the sensing node of a selected memory cell to a predetermined level, lowering the level of the sensing node of the selected memory cell with a current flowing through the selected memory cell, and comparing the voltage of the sensing node of the selected memory cell with the reference voltage.

Referring to FIGS. 7A through 9, a sensor 140 may measure a resistance $R_{dyn}$ of a variable resistor 212 of a memory cell 210. The sensor 140 may then transmit the result of the measurement to an Ra-determining circuit 220-1 to determine a resistance $R_a$ of an insertion resistor 220-2. For example, the insertion resistor 220-2 may be a variable resistor of which resistance is set according to an output of the Ra-determining circuit 220-1.

Figure 7A:
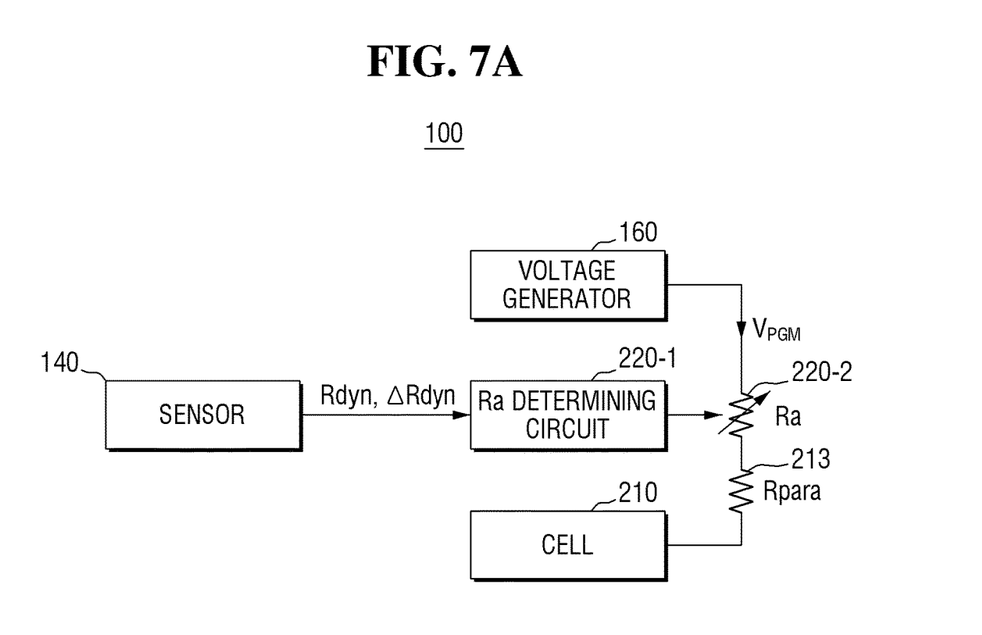
FIG. 7A is a block diagram of a memory device 100 of FIG. 5 according to an exemplary embodiment of the present inventive concept.
Figure 7B:
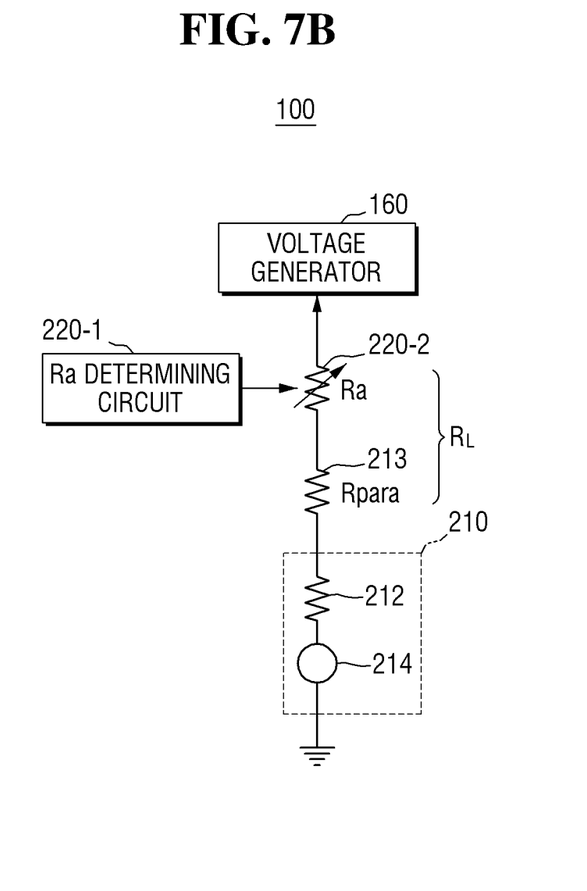
FIG. 7B is a circuit diagram of the memory device 100 of FIG. 7A according to an exemplary embodiment of the present inventive concept.

As a result, even when the amount of heat generated in the memory cell 210 during a write operation fluctuates, compensation may be made so that data is stably programmed at a uniform temperature.

The memory controller 21 and the memory device 100 of FIG. 5 may be integrated into a single semiconductor device. For example, the memory controller 21 and the memory device 100 may be integrated into a single semiconductor device to configure a memory card. For example, the memory card may include a PC card (e.g., a personal computer memory card international association (PCM-CIA)), a compact flash (CF) card, a smart media card (SM or SMC), a memory stick, a multimedia card (MMC, RS-MMC, MMCmicro), a SD card (SD, miniSD, microSD, or SDHC), a universal flash storage device (UFS), or the like. In an exemplary embodiment, the memory controller 21 and the memory device 100 may be integrated into a single semiconductor device to configure a solid state drive (SSD).

Figure 6:
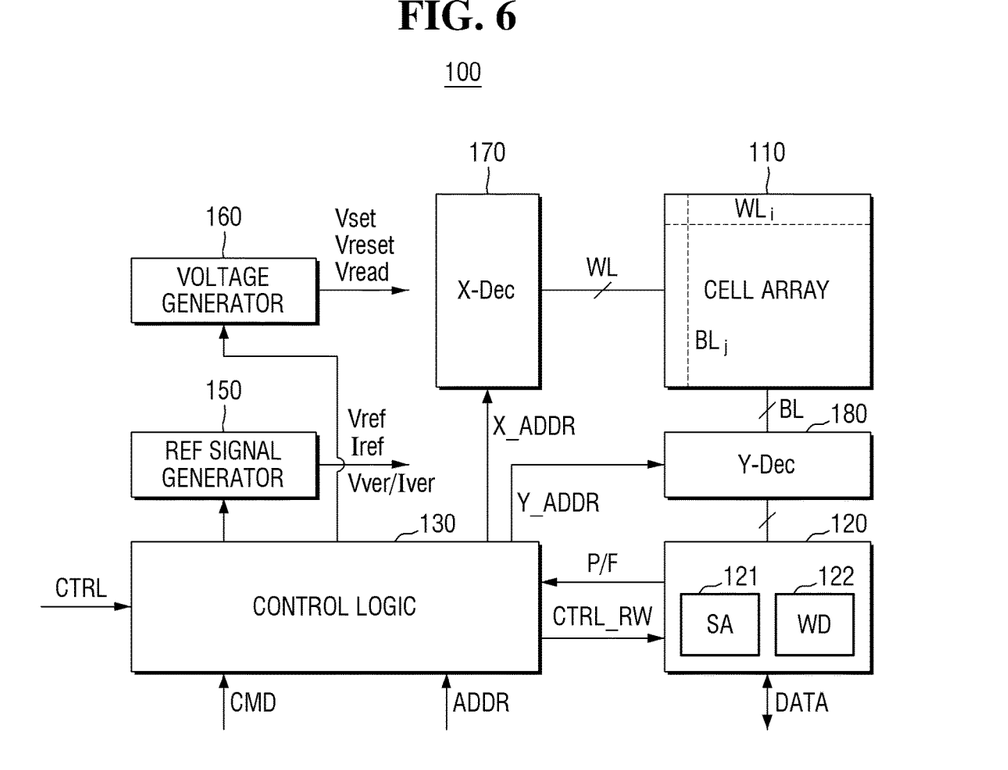
FIG. 6 is a block diagram of the memory device 100 of FIG. 5 according to an exemplary embodiment of the present inventive concept.

FIG. 6 is a block diagram of the memory device 100 of FIG. 5.

Referring to FIG. 6, the memory device 100 may include the memory cell array 110, the read/write circuit 120, and the control logic 130. The memory device 100 may further include a reference signal generator 150, a power supply generator 160, a row decoder 170, and a column decoder 180. The read/write circuit 120 may include a sense amplifier 121 and a write driver 122.

The plurality of memory cells of the memory cell array 110 may connect to the first signal lines and the second signal lines. The first signal lines may be bitlines BL, and the second signal lines may be wordlines WL. In response to various voltage or current signals being provided via the bitlines BL and the wordlines WL, data may be written to, or read from, selected memory cells, but data may be prevented from being written to, or read from, other non-selected memory cells.

The address ADDR, which is for designating a memory cell to access, may be received along with the command CMD. The address ADDR may include a row address X_ADDR for selecting a wordline $WL_i$ from the memory cell array 110 and a column address Y_ADDR for selecting a bitline $BL_j$ from the memory cell array 110. The row decoder 170 may perform a wordline selection operation according to the row address X_ADDR, and the column decoder 180 may perform a bitline selection operation according to the column address Y_ADDR.

The read/write circuit 120 may connect to the bitlines BL to write data to, or read data from, the plurality of memory cells of the memory cell array 110. For example, predetermined voltage or current signals may be provided to the memory cell array 110 via the read/write circuit 120. For example, in a case where a memory operation is performed in a unipolar manner, a set voltage Vset and a reset voltage Vreset may be generated from the power supply generator 160 and provided to the memory cell array 110 via the read/write circuit 120. In a case where a memory operation is performed in a bipolar manner, the reset voltage Vreset may be generated from the power supply generator 160 and provided to the memory cell array 110 via the row decoder 170. A read voltage Vread may be generated from the power supply generator 160 and provided to the read/write circuit 120 for a read operation.

The reference signal generator 150 may generate various reference signals for a data read operation such as a reference voltage Vref and a reference current Iref. For example, during a data read operation, the sense amplifier 121 may connect to one node (e.g., a sensing node) of a bitline BL to determine data, and the value of the data may be read by comparing a sensing voltage of the sensing node with the reference voltage Vref. In a case where the current sensing method is applied, the reference signal generator 150 may generate the reference current Iref and may provide the reference current Iref to the memory cell array 110, and the value of data may be read by comparing a sensing voltage of the sensing node caused by the reference current Iref with the reference voltage Vref.

After writing data to the memory cell array 110, a verify operation may be performed by applying a verify voltage Vver or a verify current Iver to the memory cell array 110.

The read/write circuit 120 may provide the control logic 130 with a pass/fail signal (P/F) according to the result of the reading of the value of data read from the memory cell array 110 in the verify operation. The control logic 130 may control write and read operations for the memory cell array 110 by referencing the pass/fail signal P/F.

The control logic 130 may output various control signals CTRL_RW for writing data to or reading data from the memory cell array 110, based on the command CMD, the address ADDR, and the control signal CTRL that are received from the memory controller 21. Accordingly, the control logic 130 may control various operations performed in the memory device 100.

FIG. 7A is a block diagram of the memory device 100 of FIG. 5 according to an exemplary embodiment of the present inventive concept, and FIG. 7B is a circuit diagram of the memory device 100 of FIG. 7A.

Referring to FIGS. 7A and 7B, the memory device 100 includes the memory cell 210, the Ra-determining circuit 220-1 and the insertion resistor 220-2.

As discussed above, the memory cell 210 includes the variable resistor 212 and the access element 214, which controls a current that flows in the variable resistor 212.

The insertion resistor 220 includes a resistor of which resistance is adjusted to perform compensation in case the amount of heat generated in the memory cell 210 fluctuates during a write operation. In an exemplary embodiment, the insertion resistor 220 may be connected between the memory cell 210 and the power supply generator 160 so that the insertion resistor 220 receives the power supply voltage $V_{PGM}$ from the power supply generator 160. But the present inventive concept is not limited thereto.

The amount of heat generated in the memory cell 210 may be represented by Equation (1):

$$\text{heat} = V_{PGM}^2/(R_{dyn}+R_a+R_{para})^2 * R_{dyn} \qquad \text{Equation (1),}$$

wherein "heat" denotes the amount of heat generated in the memory cell 210 and $R_{para}$ denotes the resistance of a parasitic resistor 230 between the memory cell 210 and the power supply generator 160.

Referring to Equation (1), a variation in the amount of heat generated in the memory cell 210 may be compensated by controlling the resistance $R_a$ of the insertion resistor 220, which is connected between the memory cell 210 and the power supply generator 160 that supplies the power supply voltage $V_{PGM}$ to the insertion resistor 220. The resistance Ra of the insertion resistor 220 may be determined by the Ra-determining circuit 220-1.

The memory device 100 may determine a resistance $R_{dyn}$ of the variable resistor 212 of the memory cell 210 and a variation $\Delta R_{dyn}$ in the resistance $R_{dyn}$ based on a statistical model. The statistical model is a modeling of the operating characteristics of the variable resistor 212 from data of resistances considering various process parameters. Therefore, the resistance $R_{dyn}$ of the variable resistor 212 and the variation $\Delta R_{dyn}$ in the resistance $R_{dyn}$ may vary according to specific conditions, such as specific process parameters. The sensor 140 may have the statistical model for the variation $\Delta R_{dyn}$ in the resistance $R_{dyn}$. The present inventive concept, however, is not limited thereto. For example, the Ra-determining circuit may have the statistical model for the variation $\Delta R_{dyn}$ in the resistance $R_{dyn}$.

Thereafter, the memory device 100 may determine an average resistance $R_{dyn\_avg}$ and a beta value "Beta" of the variable resistor 212 using the resistance $R_{dyn}$ of the variable resistor 212 and the variation $\Delta R_{dyn}$ in the resistance $R_{dyn}$.

For example, the memory device 200 may determine the average resistance $R_{dyn}$ using Equation (2):

$$R_{dyn}-\Delta R_{dyn} < R_{dyn\_avg} < R_{dyn}+\Delta R_{dyn} \qquad \text{Equation (2).}$$

The average resistance $R_{dyn\_avg}$ may be determined to be within the range indicated by Equation (2).

For example, the memory device 100 may determine the beta value "Beta" using Equation (3):

$$\text{Beta}(\beta) = \sqrt{((1+\Delta R_{dyn}/R_{dyn\_avg}) \ast (1-\Delta R_{dyn}/R_{dyn\_avg}))} \quad \text{Equation (3)}.$$

Thereafter, the memory device 100 may determine the resistance $R_a$ of the insertion resistor 220 using the average resistance $R_{dyn\_avg}$ and the beta value "Beta".

For example, the memory device 100 may determine a first resistance $R_L$ using the average resistance $R_{dyn\_avg}$ and the beta value "Beta" using Equation (4):

$$R_L = \text{Beta} \ast R_{dyn\_avg} \quad \text{Equation (4)}.$$

The memory device 100 may determine the resistance $R_a$ of the insertion resistor 220 using Equation (5):

$$R_a = R_L - R_{para} \quad \text{Equation (5)}.$$

For example, the memory device 100 may determine a value obtained by subtracting the resistance $R_{para}$ of the parasitic resistor 230 between the memory cell 210 and the power supply generator 160 from the first resistance $R_L$ as the resistance $R_a$ of the insertion resistor 220.

In an exemplary embodiment, the Ra-determining circuit 220-1 may receive information regarding the resistance $R_{dyn}$ of the variable resistor of 212 of the memory cell 210 and the variation $\Delta R_{dyn}$ in the resistance $R_{dyn}$ from the sensor 140.

After determining the resistance $R_a$ of the insertion resistor 220, the memory device 100 may determine a level of the power supply voltage $V_{PGM}$ according to a target amount of heat to be generated in the memory cell 210. The target amount of heat denotes a level obtained by compensating the amount of heat generated in the memory cell 210. The memory device 100 may provide the power supply voltage $V_{PGM}$ having a predetermined level to the memory cell 210 by using the power supply generator 160.

For example, the Equation (1) may be rewritten as follows:

$$V_{PGM} = (R_{dyn} + R_a + R_{para}) \ast \sqrt{(\text{heat}/R_{dyn})} \quad \text{Equation (6)}.$$

After the resistance $R_a$ of the insertion resistor 220 is determined, the level of the power supply voltage $V_{PGM}$ may be determined using the Equation (6). The level of the power supply voltage $V_{PGM}$ may be determined based on the resistance $R_{dyn}$ of the variable resistor 212 and the resistance $R_a$ of the insertion resistor 220. As a result, even when the amount of heat generated in the memory cell 210 during a program operation fluctuates, compensation may be performed so that data is stably programmed at a uniform temperature.

Figure 8:
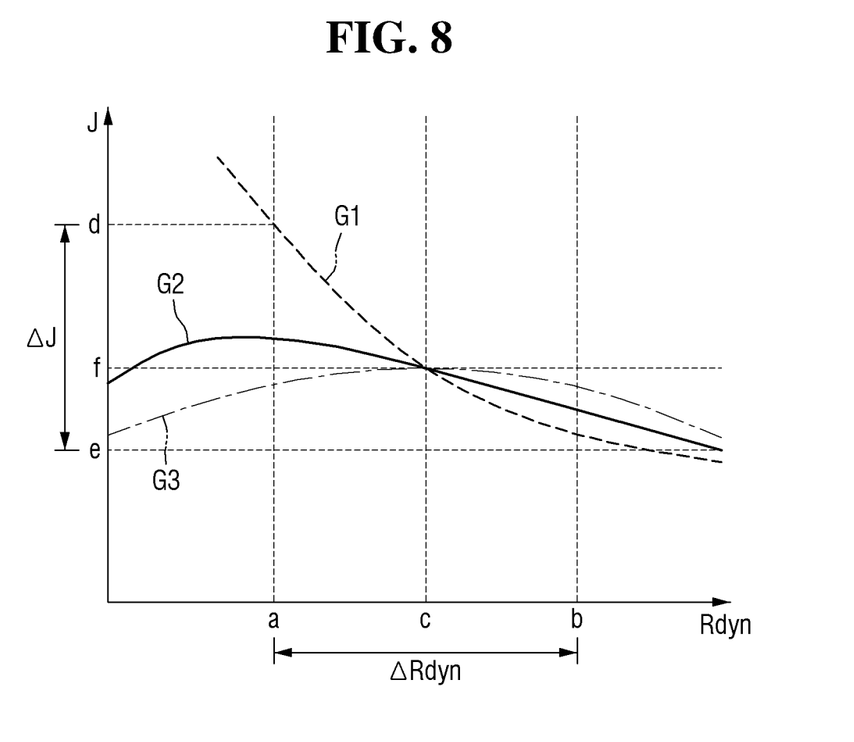
FIG. 8 is a graph illustrating the benefits of a memory device according to an exemplary embodiment of the present inventive concept.

FIG. 8 is a graph illustrating the benefits of a memory device according to an exemplary embodiment of the present inventive concept.

Referring to FIG. 8, a curve G1 represents the relationship between the amount of heat generated in a memory cell 210 and the resistance $R_{dyn}$ of the variable resistor 212 of the memory cell 210.

The curve G1 is a dotted line passing through a coordinate (a, d), a coordinate (c, f), and a coordinate (b, e). The section between a and b corresponds to a variation $\Delta R_{dyn}$ in the resistance $R_{dyn}$ of the variable resistor 212, and the section between d and e corresponds to a variation $\Delta J$ in the amount of heat generated in the memory cell 210.

The relationship between the amount of heat generated in the memory cell 210 and the resistance $R_{dyn}$ of the variable resistor 212 when the beta value "Beta" is a first value may be represented by a curve G2. The relationship between the amount of heat generated in the memory cell 210 and the resistance $R_{dyn}$ of the variable resistor 212 when the beta value "Beta" is a second value may be represented by a curve G3.

The curve G2 is lower than the curve G1 on the left side of the coordinate (c, f) and is higher than the curve G1 on the right side of the coordinate (c, f). For example, the curve G2 has a smaller slope than the curve G1, which means that the variation $\Delta J$ in the amount of heat generated in the memory cell 210 for the variation $\Delta R_{dyn}$ in the resistance $R_{dyn}$ of the variable resistor 212 is smaller for the curve G2 than for the curve G1.

The curve G3 is lower than the curve G2 on the left side of the coordinates (c, f) and is higher than the curve G2 on the right side of the coordinates (c, f). For example, the curve G3 has a smaller slope than the curve G2, which means that the variation $\Delta J$ in the amount of heat generated in the memory cell 210 for the variation $\Delta R_{dyn}$ in the resistance $R_{dyn}$ of the variable resistor 212 is even smaller for the curve G3 than for the curve G1.

By controlling the beta value "Beta" in the aforementioned manner, compensation may be properly performed even when the amount of heat generated in the memory cell 210 during a program operation fluctuates.

Figure 9:
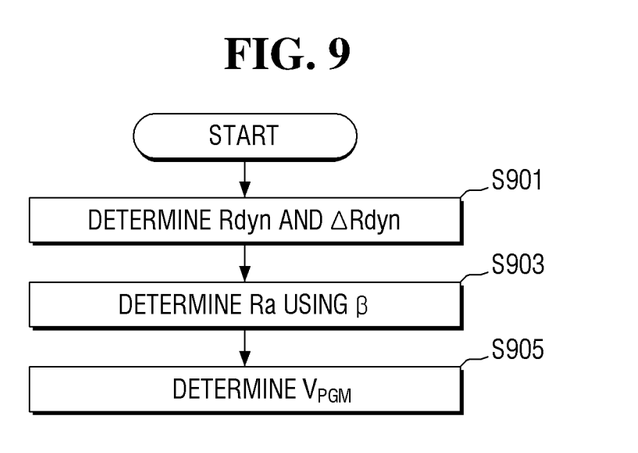
FIG. 9 is a flowchart illustrating an operating method of a memory device according to an exemplary embodiment of the present inventive concept.

FIG. 9 is a flowchart illustrating an operating method of a memory device according to an exemplary embodiment of the present inventive concept.

Referring to FIGS. 7A, 7B and 9, in S901, the resistance $R_{dyn}$ of the variable resistor 212 of the memory cell 210 and the variation $\Delta R_{dyn}$ in the resistance $R_{dyn}$ are determined.

In S903, the average resistance $R_{dyn\_avg}$ and the beta ($\beta$) value of the variable resistor 212 are determined using the resistance $R_{dyn}$; while the variation $\Delta R_{dyn}$ in the resistance $R_{dyn}$, and the resistance $R_a$ of an insertion resistor 220 are determined using the average resistance $R_{dyn\_avg}$ and the beta value.

For example, the first resistance $R_L$ is determined using the average resistance $R_{dyn\_avg}$ and the beta value, and a value obtained by subtracting the resistance $R_{para}$ of the parasitic resistor 230 between the memory cell 210 and the power supply generator 160 generating the power supply voltage $V_{PGM}$ from the first resistance $R_L$ is determined as the resistance $R_a$.

In S905, the level of the power supply voltage $V_{PGM}$ is determined according to the target amount of heat generated in the memory cell 210.

The operating method may further include providing the power supply voltage $V_{PGM}$ having the predetermined level to the memory cell 210 by using the power supply generator 160.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. An operating method of a memory device, comprising:
   determining a resistance Rdyn of a variable resistor of a memory cell and a variation ΔRdyn of the resistance Rdyn based on a statistical model;
   determining an average resistance Rdyn_avg and a beta value of the variable resistor using the resistance Rdyn and the variation ΔRdyn of the resistance Rdyn;
   determining a resistance Ra of an insertion resistor, connected in series between the memory cell and a power supply generator for generating a power supply voltage VPGM, using the average resistance Rdyn_avg and the beta value;

determining, using the resistance Ra, a level of the power supply voltage VPGM according to a target amount of heat generated in the memory cell; and providing the level of the power supply voltage VPGM to the memory cell by using the power supply generator.

2. The operating method of claim 1, wherein the average resistance Rdyn_avg is determined by the following equation:

$Rdyn-\Delta Rdyn < Rdyn\_avg < Rdyn+\Delta Rdyn.$

3. The operating method of claim 1, wherein the beta value is determined by the following equation:

$\sqrt{((1+\Delta Rdyn/Rdyn\_avg)*(1-\Delta Rdyn/Rdyn\_avg))}.$

4. The operating method of claim 1, wherein the determining of the resistance $R_a$ of the insertion resistor comprises:

determining a first resistance RL using the average resistance Rdyn_avg and the beta value; and subtracting a resistance Rpara of a parasitic resistor between the memory cell and the power supply generator from the first resistance RL to obtain the resistance Ra.

5. The operating method of claim 1, wherein the target amount of heat is determined by the following equation:

$VPGM2/(Rdyn+Ra+Rpara)2*Rdyn.$

6. The operating method of claim 1, wherein the determining of the resistance Rdyn and the variation ΔRdyn of the resistance Rdyn comprises:

determining the resistance Rdyn and the variation ΔRdyn of the resistance Rdyn using a sensor; and receiving the resistance Rdyn and the variation ΔRdyn from the sensor.

7. An operating method of a memory device, comprising:

determining a resistance Rdyn of a variable resistor of a memory cell and a variation ΔRdyn in the resistance Rdyn based on a statistical model;

determining an average resistance Rdyn_avg and a beta value of the variable resistor using the resistance Rdyn and the variation ΔRdyn of the resistance Rdyn;

determining a first resistance RL using the average resistance Rdyn_avg and the beta value;

determining a resistance Rpara of a parasitic resistor between the memory cell and a power supply generator for generating a power supply voltage VPGM;

determining a resistance Ra of an insertion resistor, connected in series between the memory cell and the power supply generator, using the first resistance RL and the resistance Rpara of the parasitic resistor;

determining, using the resistance Ra, a level of the power supply voltage VPGM according to a target amount of heat generated in the memory cell; and providing the power supply voltage VPGM to the memory cell by using a power supply generator.

8. The operating method of claim 7, wherein the average resistance Rdyn_avg is determined by the following equation:

$Rdyn-\Delta Rdyn < Rdyn\_avg < Rdyn+\Delta Rdyn.$

9. The operating method of claim 7, wherein the beta value is determined by the following equation:

$\sqrt{((1+\Delta Rdyn/Rdyn\_avg)*(1-\Delta Rdyn/Rdyn\_avg))}.$

10. The operating method of claim 7, wherein the target amount of heat is determined by the following equation:

$VPGM2/(Rdyn+Ra+Rpara)2*Rdyn.$

11. The operating method of claim 7, wherein the determining of the resistance Rdyn and the variation ΔRdyn of the resistance Rdyn, comprises:

determining the resistance Rdyn and the variation ΔRdyn of the resistance Rdyn using a sensor; and receiving the resistance Rdyn and the variation ΔRdyn from the sensor.

12. An operating method of a memory device including a variable resistor of a memory cell, a power supply generator, and an insertion resistor connected between the variable resistor of the memory cell and the power supply generator, comprising: determining a resistance Rdyn of the variable resistor and a variation ΔRdyn of the resistance Rdyn based on a statistical model; determining a resistance Ra of an insertion resistor based on the resistance Rdyn of the variable resistor and the variation ΔRdyn of the resistance Rdyn; and generating a power supply voltage VPGM based on the resistance Rdyn of the variable resistor and the resistance Ra of the insertion resistor, wherein the power supply voltage VPGM is applied to the variable resistor and the insertion resistor connected in Rdyn series; and wherein the determining of the resistance Ra of the insertion resistor comprises determining an average resistance Rdynavg and a beta value of the variable resistor using the resistance Rdyn and the variation ΔRdyn of the resistance Rdyn; and determining the resistance Ra of the insertion resistor using the average resistance Rdynavg and the beta value.

13. The operating method of claim 12, wherein a level of the power supply voltage VPGM is determined such that if the power supply voltage VPGM is applied to the memory cell by the power supply generator, a target amount of heat is generated in the memory cell.

14. The operating method of claim 13, wherein the target amount of heat is determined by the following equation:

$VPGM2/(Rdyn+Ra+Rpara)2*Rdyn.$

15. The operating method of claim 12, wherein the beta value is determined by the following equation:

$\sqrt{((1+\Delta Rdyn/Rdyn\_avg)*(1-\Delta Rdyn/Rdyn\_avg))}.$

* * * * *